United States Patent
Hamilton, Jr. et al.

(10) Patent No.: US 6,455,931 B1
(45) Date of Patent: Sep. 24, 2002

(54) MONOLITHIC MICROELECTRONIC ARRAY STRUCTURE HAVING SUBSTRATE ISLANDS AND ITS FABRICATION

(75) Inventors: William J. Hamilton, Jr., Ventura; Michael Ray; Eli E. Gordon, both of Goleta; Christopher L. Fletcher, Santa Barbara; Ronald W. Berry, Goleta, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/859,618

(22) Filed: May 15, 2001

(51) Int. Cl.[7] ............................................... H01L 23/34
(52) U.S. Cl. ....................................... 257/723; 250/332
(58) Field of Search .............................. 437/2; 250/332; 345/8; 257/723

(56) References Cited

U.S. PATENT DOCUMENTS

| | | | |
|---|---|---|---|
| 4,361,384 A | * 11/1982 | Bosserman | 350/174 |
| 4,754,544 A | * 7/1988 | Hanak | 437/2 |
| 5,321,416 A | * 6/1994 | Bassett et al. | 345/8 |
| 6,031,231 A | * 2/2000 | Kimata et al. | 250/332 |
| 6,140,980 A | * 10/2000 | Spitzer et al. | 345/8 |
| 6,324,308 B1 | * 11/2001 | Chen et al. | 382/275 |

* cited by examiner

Primary Examiner—David Nelms
Assistant Examiner—Tu-Tu Ho
(74) Attorney, Agent, or Firm—William C. Schubert; Glenn H. Larzen, Jr.

(57) ABSTRACT

A monolithic microelectronic array structure includes a microelectronic integrated circuit array having a first plurality of microelectronic integrated circuit elements each deposited on a front side of a substrate. The substrates are physically discontinuous so that each substrate comprises a substrate island which is physically separated from the other substrate islands. The monolithic microelectronic array structure optionally includes a first plurality of input/output elements with a respective input/output element associated with and directly connected to each of the microelectronic integrated circuit elements, and a second plurality of electrically conductive interconnects extending between the microelectronic integrated circuit elements of adjacent substrate islands. The monolithic microelectronic array structure may be planar, or it may be curved.

23 Claims, 4 Drawing Sheets

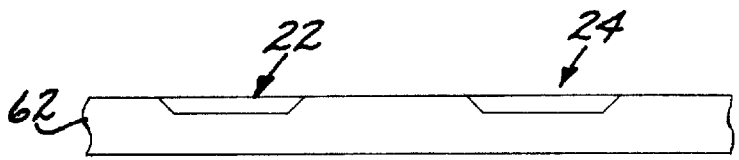
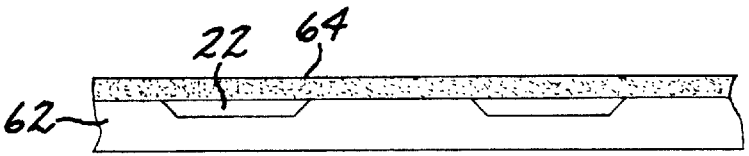
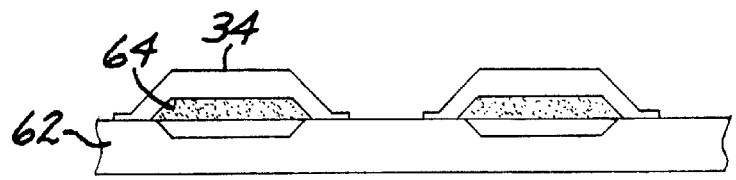
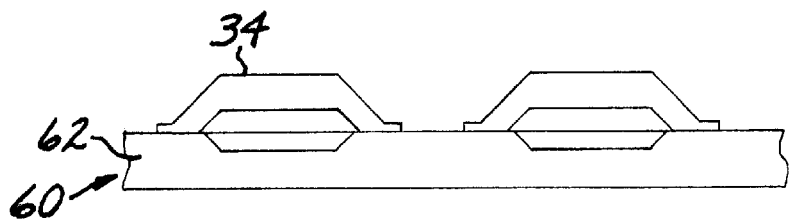
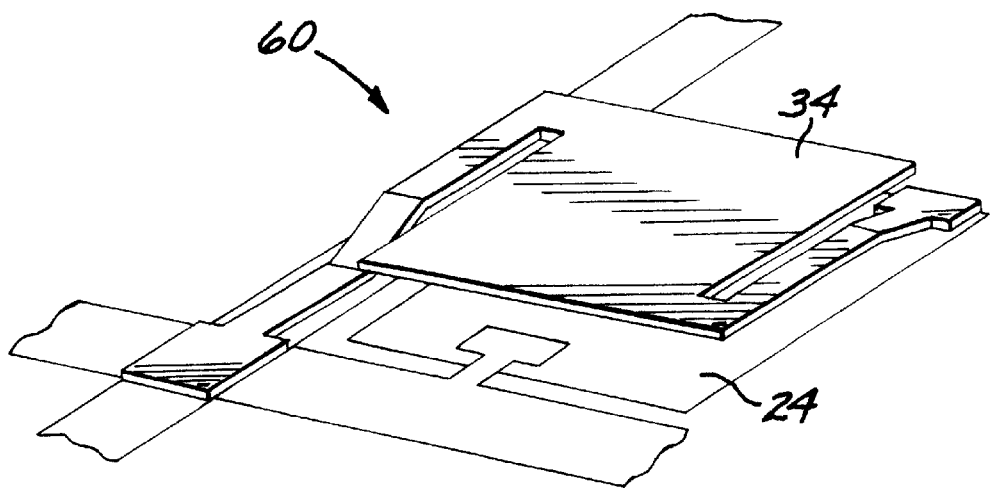

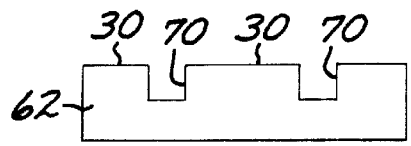
FIG.14
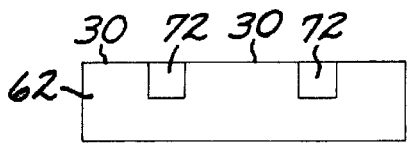
FIG.15

FIG.20

MONOLITHIC MICROELECTRONIC ARRAY STRUCTURE HAVING SUBSTRATE ISLANDS AND ITS FABRICATION

This invention was made with government support under contract No. N66001-98-C-8622 awarded by the Department of the Navy. The government has certain rights in this invention.

This invention relates to monolithic microelectronic array structures and, more particularly, to a monolithic microelectronic array structure formed on discontinuous substrate islands.

BACKGROUND OF THE INVENTION

Many imaging sensor systems utilize an optical system to focus the infrared or visible-light energy of a scene onto a detector array. One widely used detector array is the focal plane array (FPA), in which an array of detector elements is positioned at the focal plane of the optical system. The infrared or visible-light energy focused onto the detector elements is converted to electrical signals. The electrical signals indicative of the image are viewed on a display or processed by a computer, as for example with pattern recognition techniques.

There are two commonly used types of FPA detector element arrays. The most sensitive FPA detector arrays are hybrid detector array structures that use an optimized detector array and an optimized readout integrated circuit, with the respective detector arrays and the readout integrated circuits joined by an electrical interconnect structure in the form of metallic bumps. A less sensitive FPA detector array is a monolithic microelectronic array structure formed of an array of readout circuit elements deposited on a substrate with a detector element directly connected to each of the readout circuit elements. In each case, the detector elements of the detector array are arranged to define pixels of an image and convert the incident infrared or visible-light energy to output electrical signals. The respective readout integrated circuits amplify and condition the electrical signals for subsequent use.

The present invention relates to monolithic microelectronic array structures. Although the monolithic microelectronic array structures are less sensitive than the hybrid detector array structures when used as light detectors, the monolithic microelectronic array structures have important applications such as in uncooled man-portable night vision systems that must operate uncooled at ambient temperature, be less costly to produce, and consume less power than the hybrid detector array structures.

Monolithic microelectronic array structures of several types are available and are widely used in focal plane arrays. However, the present inventors have recognized that available monolithic microelectronic array structures have limitations on their geometries and performance. Certain geometries of imaging sensor systems that would otherwise be highly advantageous cannot be made with available monolithic microelectronic array structures. Some of the same problems arise with light-emitter arrays such as diode or laser arrays, and with other types of microelectronic integrated circuit arrays.

There is therefore a need for an improved monolithic microelectronic array structure. The present invention fulfills this need, and further provides related advantages.

SUMMARY OF THE INVENTION

The present invention provides a monolithic microelectronic array structure and a method for its fabrication. The monolithic microelectronic array structure may be made in a planar or curved form. In either a planar (flat) or curved form, there is a mechanical isolation between the microelectronic integrated circuit elements that reduces the incidence of thermal strains and stresses. When in a curved form, the monolithic microelectronic array structure may be conformed to a nonplanar focal surface that allows the construction of microelectronic systems not heretofore possible.

In accordance with the invention, a monolithic microelectronic array structure comprises a microelectronic integrated circuit array comprising a first plurality of substantially identical microelectronic integrated circuit elements, each deposited on a front side of one of a plurality of substrates. The substrates are physically discontinuous so that each substrate comprises a substrate island which is physically separated from the other substrate islands. There is a second plurality of electrically conductive, structurally flexible interconnects extending between the microelectronic integrated circuit elements of adjacent substrate islands.

In one embodiment, each microelectronic integrated circuit element comprises an electrical interface circuit and an input/output element supported on the electrical interface circuit. The electrical interface circuit may be a readout integrated circuit, and the input/output element is a detector of light. The electrical interface circuit may be a driver integrated circuit, and the input/output element is an emitter of light.

The monolithic microelectronic array structure may be substantially planar. In another form made possible by the segmented structure of the islands and the interconnects, the monolithic microelectronic array structure is curved in single or double curvature. Desirably, each electrically conductive interconnect is structurally flexible. In one form, each electrically conductive interconnect between two adjacent islands is curved in a perpendicular plane that is perpendicular to an extrapolated intersection line between the two islands it connects. In another form, each electrically conductive interconnect between two islands is curved in an included plane that includes an extrapolated intersection line between the two islands it connects.

In a typical case, each substrate is made of a substantially inflexible material such as a piece of silicon. Although the substrate islands are physically separated from each other, there may be a continuous flexible support to which a back side of each substrate island is affixed.

The substrate islands may have exactly one readout integrated circuit element on each substrate island. They may instead have more than one readout integrated circuit element on each substrate island.

A method for preparing a monolithic microelectronic array structure includes providing an initial structure comprising a planar physically continuous substrate, and a first plurality of microelectronic integrated circuit elements each deposited on a front side of the planar physically continuous substrate. A second plurality of electrically conductive interconnects is deposited to extend between adjacent microelectronic integrated circuit elements. The method further includes trenching the planar physically continuous substrate from a back side thereof to form a trenched structure and to physically separate the planar physically continuous substrate into a first plurality of physically discontinuous substrate islands with at least one of the electrically conductive interconnects extending between each adjacent substrate island. This trenched structure may be used flat, or it may be deformed into a curved structure in the event that the electrically conductive interconnects are structurally flexible. Other features of the structure may be provided as described above.

When used as a detector, the structure of the monolithic microelectronic array may be advantageously employed in a singly (e.g., a segment of a cylindrical surface) or doubly (e.g., a segment of a spherical surface) curved form, or a complexly curved form. The curved monolithic detector array is positioned as a focal surface array (comparable to a focal plane array or FPA, except that it is not planar) at a similarly curved focal surface of an imaging sensor system. Such a curved focal surface approach offers particular advantages for compact, wide-angle sensors (or emitters), which have not heretofore been possible.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 3–6 schematic elevational views of the monolithic microelectronic array structure various stages of the fabrication process;

FIG. 7 is a perspective view of a monolithic detector/readout array structure;

FIGS. 14–20 are schematic elevational views at stages in the fabrication of the electrically conductive interconnects.

DETAILED DESCRIPTION OF THE INVENTION

Figure 1:
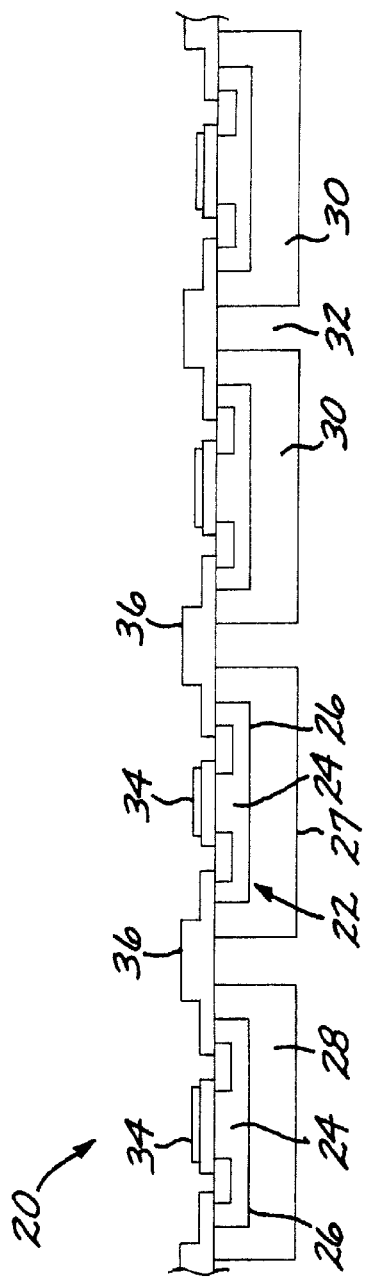
FIG. 1 is a schematic elevational view of a monolithic microelectronic array structure according to the invention.

FIG. 1 illustrates a monolithic microelectronic array structure 20 according to the invention. The monolithic microelectronic array structure 20 is described and illustrated in terms of its most preferred form of a detector structure, with references to alternative structures. The monolithic microelectronic array structure 20 comprises a readout integrated circuit array 22 comprising a first plurality of readout integrated circuit elements 24 each deposited on a front side 26 of a substrate 28. The substrate 28 has an oppositely disposed back side 27. The readout integrated circuit elements 24 are microelectronic circuits that amplify and condition the electrical outputs of their respective detectors (to be discussed subsequently). Such readout integrated circuit elements 24 are known in the art, except for the improvements and modifications set forth herein.

The substrates 28 are physically discontinuous so that each substrate 28 is a substrate island 30 which is physically separated from the other substrate islands 30 with a gap 32 therebetween. There may be exactly one readout integrated circuit element 24 formed on each substrate island 30, or there may be more than one readout integrated circuit element 24 formed on each substrate island 30. This physical discontinuity of the substrates 28 and the gap 32 therebetween is an important feature of the invention. A monolithic microelectronic array structure with a single physically continuous substrate is known in the art, but it lacks the advantages of the discontinuous substrates 28 in the form of the substrate islands 30. The substrates 28 are typically made of a relatively inflexible material, such as a piece of silicon, and the physical separation allows the array of substrates 28 to flex and curve as desired. Additionally, electrical cross talk between the electronic circuits on the different substrate islands 30 is thereby avoided.

The monolithic microelectronic array structure 20 also has a first plurality of detector elements 34 with a respective detector element 34 associated with and directly connected to each of the readout integrated circuit elements 24, which in turn are affixed to the substrate islands 30. In one embodiment used to detect infrared energy, the detector elements 34 are microbolometers which produce an electrical output signals responsive to slight changes in heat when infrared energy impinges upon the microbolometer. A typical microbolometer structure is a freestanding bridge of $Si_3N_4$, $VO_x$, and $Si_3N_4$ layers. Other types of detectors may be used as well.

In the imaging application, the readout integrated circuit elements 24 and their detector elements 34 are arranged in a regular array to define the pixels of an image. Each of the readout integrated circuit elements 24 is substantially identical to the other readout integrated circuit elements 24 (except for manufacturing variations), and each of the detector elements 34 is substantially identical to the other detector elements 34 (except for manufacturing variations).

Except for the modifications and improvements discussed herein, the preferred microbolometer-based detectors and their readout circuits are known in the art. See, for example, U.S. Pat. Nos. RE 36,706; 36,136; U.S. Pat. Nos. 5,534,111; 6,144,030; 6,201,243; 5,010,251; 5,021,663; 5,288,649; 5,399,897; and 5,831,266, all of whose disclosures are incorporated herein in their entireties.

The readout integrated circuit elements 24 are more generally described as microelectronic integrated circuit elements. They may function as an electrical interface circuit of an input/output device, with an input/output element supported on the electrical interface circuit. In the preferred structure described herein, the electrical interface circuit is the readout integrated circuit 24, and the input/output element is the detector element 34. In an alternative that is also within the scope of the present approach, the electrical interface circuit is a driver integrated circuit, and the input/output element is an emitter that emits light or other radiation, such as a light-emitting diode or a laser such as a laser diode. Each driver integrated circuit may drive one or more emitters. Each driver integrated circuit provides the driving command and energy for its emitter or emitters. The microelectronic integrated circuit elements may be of other types as well. The present disclosure is applicable to all of these other circuit types such as the emitter and the other types, with appropriate modifications to the descriptions.

Returning to the discussion of the preferred embodiment but keeping in mind that the description is applicable to the other monolithic microelectronic array structures as well, a second plurality of electrically conductive interconnects 36 extends between the readout integrated circuit elements 24 of adjacent substrate islands 30. These electrically conductive interconnects 36 are typically formed of metal such as aluminum, copper, or gold. They conduct signals such as bias and clocking signals to the readout integrated circuit elements 24, and output signals from the readout integrated circuit elements 24.

The electrically conductive interconnects 36 are preferably structurally flexible. As used herein, "structurally flexible" means that the electrically conductive interconnect has a structure that allows it to flex more readily than would be possible from a rectangular piece of the material of the same general size. The interconnect is made of a metal that may stretch elastically and plastically as well as mechanically flex. Two preferred forms of structurally flexible electrically conductive interconnects 36 will be discussed subsequently.

The structural flexibility of the electrically conductive interconnects 36 allows the substrate islands 30 and their supported detector elements 34 to move in up to three rotational and three translational degrees of freedom, so that they accommodate thermal strains and, for the case of the curved array, remain piecewise tangential to the desired curved surface. If the electrically conductive interconnects 36 are rigid in the sense that they do not permit the movement in the requisite degrees of freedom, the array of detector elements 34 cannot bend to the necessary curvature in one or two dimensions of flexure, and array defects such as ripples, wrinkles, and folds result.

The dimensions of the monolithic microelectronic array structure 20 are not critical. In a typical case, however, the readout integrated circuit elements 24 are in a square array spaced about 50 micrometers center-to-center along the sides of the square to define the pixels of a regular detector array. The substrate islands 30, which in the preferred case each have multiple detector elements 34 and readout integrated circuit elements 24, are about 400 micrometers on a side. The gap 32 between the substrate islands 30 is preferably small, typically about 10–20 micrometers wide. The detector elements 34 are about 0.2–0.5 micrometers thick, and the substrates 28 are about 50–75 micrometers thick. The monolithic microelectronic array structure 20 may be substantially planar, as illustrated in FIG. 1, or it may be curved, as will be discussed subsequently.

Figure 2:
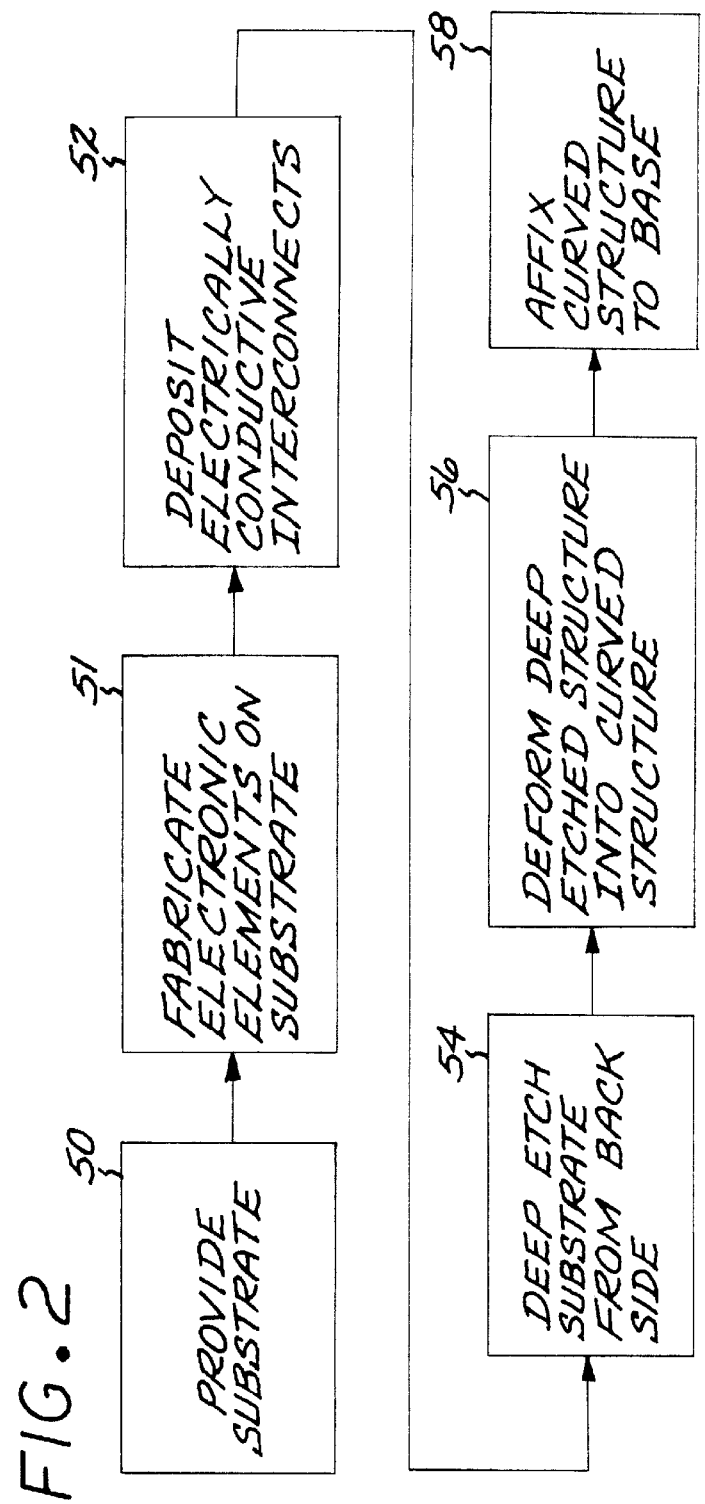
FIG. 2 is a block flow diagram of an approach for fabricating the monolithic microelectronic array structure.

FIG. 2 depicts a method for forming the monolithic microelectronic array structure 20. FIGS. 3–6 illustrate the general approach for preparing an initial structure 60 used in the subsequent processing, and FIG. 7 illustrates the initial structure 60. Elements already discussed that are found in the initial structure 60 are labeled with the same identifying numerals in FIGS. 3–7, and the prior discussion is incorporated.

A substrate 62 is provided, numeral 50, and the readout integrated circuit array 22 with its readout integrated circuits 24 is fabricated on the substrate 62 by conventional microelectronic techniques, numeral 51. The substrate 62 is single-crystal silicon material about 0.016–0.018 inch thick in the preferred embodiment. The substrate 62 is a solid wafer of the substrate material, without being segmented into islands at this point of the processing, see FIG. 3. A sacrificial layer 64 is deposited on the substrate 62, as seen in FIG. 4. The details of the fabrication step 51 are known in the art for each type of circuit that may be used in the readout integrated circuit array 22.

The sacrificial layer 64 is patterned, and the layers that constitute the microbolometer detector element 34 are deposited over the patterned sacrificial layer 64, see FIG. 5. After deposition of the microbolometer detector element 34, the structure is immersed in a solvent that dissolves the sacrificial layer 64, leaving the freestanding bridges that constitute the microbolometer detector elements 34. The resulting structure is the initial structure 60 used in the subsequent fabrication of the monolithic microelectronic array structure 20, which is shown in FIG. 6 prior to removal of the sacrificial layer 64 and also in FIG. 7 after removal of the sacrificial layer 64. Complete details of the preparation of the microbolometers are provided in the above-referenced patents.

Figure 8:
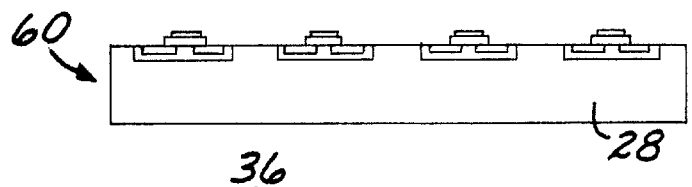
FIGS. 8–13 are schematic elevational views at stages in the fabrication of a detector/readout integrated circuit array.
Figure 9:
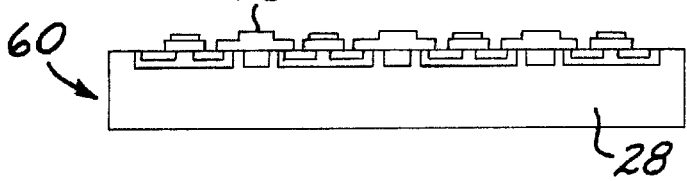

Returning to the discussion of FIG. 2, the electrically conductive interconnects 36 are deposited, numeral 52. FIGS. 8–13 illustrate the structures resulting from the steps 54–58 illustrated in FIG. 2. FIG. 8 is the initial structure 60 of FIG. 7 but shown in elevational view, and FIG. 9 shows the initial structure 60 after the electrically conductive interconnects 36 are deposited in step 52.

FIGS. 14–20 illustrate the preferred process steps for forming the electrically conductive interconnects 36. The order of the steps may be changed as desired. The substrate is first etched by reactive ion etching to form trenches 70 that define what will eventually be the substrate islands 30, as seen in FIG. 14. FIG. 14 shows the trenches 70 etched from the back side, but they could alternatively be etched from the front side. (In FIGS. 14–20, the readout integrated circuit elements 24 are omitted for clarity in the illustration, but they are present in fact.) The trenches 70 are typically about 4–15 micrometers wide and 4–6 micrometers deep. The trenches 70 are filled with a polymer filler 72, preferably a polyimide, to provide bridges for metallic interconnects, FIG. 15. The upwardly facing surface of the polymer filler 72 is photolithographically patterned to produce a desired nonplanar shape which results in the desired shape of the metal deposited overlying the polymer filler 72, as discussed next.

Metallic lines 74, typically of gold or copper about 1 micrometer thick, are deposited overlying the polymer filler 72, preferably by liftoff lithography, resulting in the illustrated nonplanar shape. The deposition step 52 is preferably accomplished by vapor deposition. Liquid-phase deposition of the metal, such as ink jet deposition of a metallic-containing composition, may also be used. The key point is that the metallic lines 74 must be deposited onto the structure from a flowable state in order to attain the desired small dimensions. The metallic lines 74 may not be furnished as freestanding elements such as wirebond wires or leadframes, because such freestanding elements may not be used to fabricate structures of the required small sizes. The technology of bonding freestanding elements requires that the bonding pads be at least about 100 micrometers on a side, although in some cases it is possible to bond to bonding pads as small as about 25 micrometers on a side. The present approach of fabricating pixel arrays requires much smaller bonding pads and structures, 15 micrometers in dimension or smaller, and preferably smaller than 10 micrometers. Thus, the metallic lines 74 must be deposited from the gaseous or liquid phase. These deposited metallic lines 74 are structurally distinguished from freestanding elements by their fine-scale metallurgical structure and by their small physical size.

Figure 16:
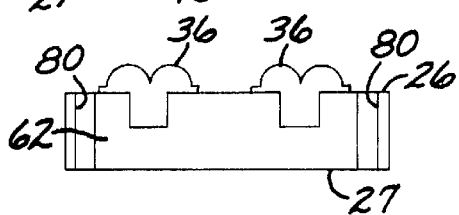
Figure 17:
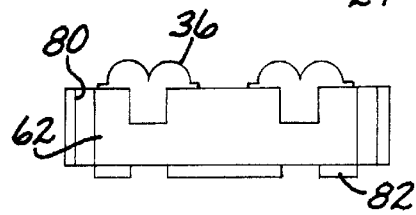

The nonplanar metallic lines 74 eventually serve as the electrical conductors of the electrically conductive interconnects 36, and are deposited to contact the connector pads of the readout integrated circuit elements on the substrate islands 30. In this illustrated embodiment, each metallic line 74 and its electrically conductive interconnect 36 between two substrate islands 30 are curved in a perpendicular plane 76 that is perpendicular to an extrapolated intersection line 78, depicted as a dot representing a line extending out of the plane of the page, between the two substrate islands 30 it connects. In the illustration of FIG. 16, the extrapolated intersection line 78 extends perpendicular to the plane of the illustration, and the perpendicular plane 76 is the plane of the illustration. Each of the metallic lines 74 and its electrically conductive interconnect 36 is therefore structurally flexible because it may easily flex. To aid in establishing precise locating of the subsequent deep etching from the back side 27 of the substrate 62, locating holes 80 are drilled, preferably by laser drilling, through the substrate 62 between the front side 26 and the back side 27, as seen in FIG. 17. Alternatively, the etching may be from the front side 26.

Figure 21:
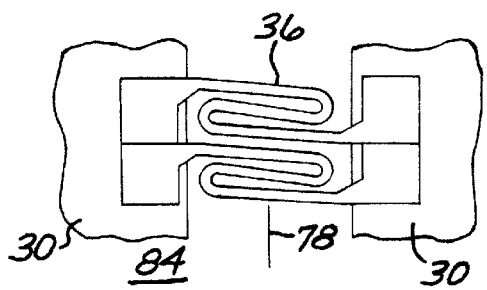
FIG. 21 is a schematic plan view of another embodiment of an electrically conductive interconnect.

Another operable structure for the electrical conductor interconnection 36 is illustrated in plan view (i.e., from above) in FIG. 21. In this case, each electrically conductive interconnect 36 between two substrate islands 30 is curved in the form of a serpentine lying in an included plane 84 that includes the extrapolated intersection line 78 between the two substrate islands 30 it connects. In FIG. 21, the included plane 84 and the intersection line 78 both lie in the plane of the illustration.

Optionally but preferably, the substrates 28 are next thinned from the back side 27 to a thickness of about 50 micrometers by any operable technique, with diamond point turning being preferred. Other operable techniques include, for example, conventional lapping and polishing, and chemo-mechanical polishing.

Figure 10:
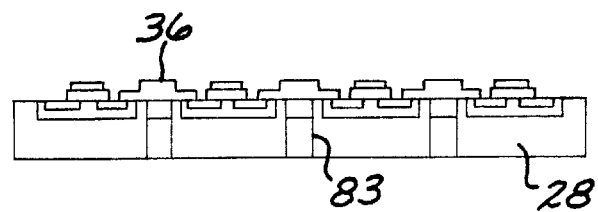
Figure 18:
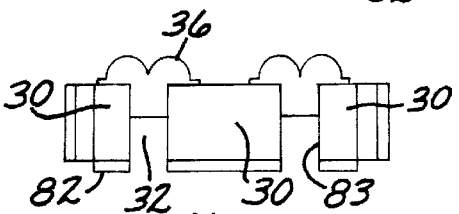
Figure 19:
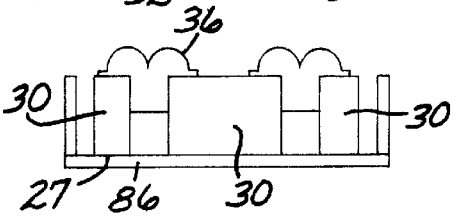

The back side 27 is patterned with a mask 82 of a material such as aluminum, using the locating holes 80 as guides for positioning of the mask 82, see FIG. 18. The planar, physically continuous substrate 62 is deep etched, numeral 54 of FIG. 2, preferably by reactive ion etching from the back side 27 thereof, to form a deep etched structure having deep etched channels 83 shown in FIG. 19. As noted earlier, the deep etching may instead be from the front side, but care must be taken to mask the electronic components on the front side. The deep etched channels 83 are aligned with the electrically conductive interconnects 36 and extend from the back side 27 to the underside of the polymer filler 72 and the electrically conductive interconnects 36. These deep etched channels 83 define the gaps 32 and serve to physically separate the planar, originally physically continuous substrate 62 into the first plurality of physically discontinuous substrate islands 30. At least one of the electrically conductive interconnects 36 extends between each adjacent substrate island 30 and specifically between the readout integrated circuits 24 on the substrate islands 30. The mask 82 may thereafter be either left in place or removed. FIG. 10 illustrates the resulting structure for the case where the mask 82 is removed, which is a fully operable flat, planar monolithic microelectronic array structure 20.

Figure 11:
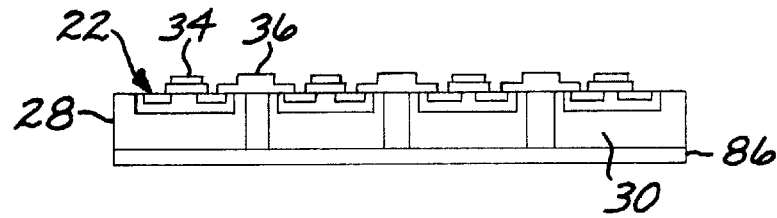
Figure 12:
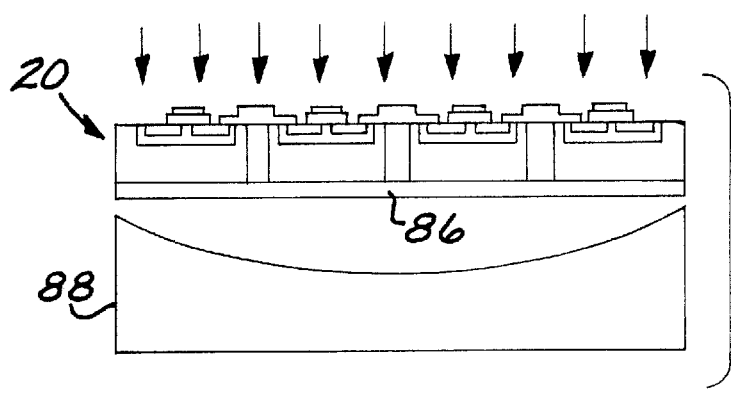

For some applications, it is desired that the monolithic microelectronic array structure 20 be curved to lie along a curved surface that is a curved surface 90 such as a focal surface or other type of curved surface. To accomplish the curving of the flat monolithic microelectronic array structure 20, it is preferred to apply a continuous flexible support 86 to which a back side of each substrate island 30 is affixed. FIGS. 11 and 20 illustrate the positioning of the continuous flexible support 86. The continuous flexible support 86 is preferably a ductile metal film of copper or other operable metal that is adhered to the back side 27 of the substrate 28 with a glue adhesive or other operable approach. The flexible metal support 86 holds the array of detector elements 34 in its desired orientation with high precision, even after the array is deformed to a curved shape (as in FIG. 13). The continuous flexible support 86 may instead be a polymer layer of a material such as a polyimide that is spin cast onto the back side 27 of the substrate islands 30. The substrate islands 30 remain physically separated from each other, but the continuous flexible support 86 provides support in subsequent operations.

The monolithic microelectronic array structure 20 is deformed into a curved shape and structure, numeral 56 of FIG. 2. The deforming may be accomplished by any operable approach and deforming force. For example, it may be gently deformed with mechanical loading, as illustrated by the downwardly directed arrows in FIG. 12. Preferably, the deforming 56 is accomplished with a gas pressure applied from the concave side of the deforming structure or a vacuum applied from the convex side of the deforming structure. A punch or die may be used but is less preferred because of the greater likelihood of damaging the electronics on the front side 26 of the substrate islands 30. The continuous flexible support 86 serves as a membrane to support the gas pressure or vacuum. Absent the substrate island structure, the monolithic microelectronic array structure 20 could not be readily deformed into a curved shape in this manner. The tiled island structure allows the monolithic microelectronic array structure 20 to be deformed into singly curved (i.e., described by a curvature in one dimension, such as a segment of a cylindrical surface) or doubly curved (i.e., described by a curvature in two dimensions, such as a segment of a spherical surface) configurations that follow the curved surface 90.

During the deforming step 56, each of the substrate islands 30 and the microelectronic structure thereon remains substantially planar, and does not itself deform to follow the curvature of the curved surface 90. Instead, the curved shape is closely approximated by curving the array so that some portion (preferably the center) of each of the detector elements is tangential to the desired curved surface 90, a relationship termed "piecewise tangential".

The deformed and curved monolithic microelectronic array structure 20 is preferably deformed against a die whose surface follows the curved surface 90. The deformed and curved monolithic microelectronic array structure 20 will not typically maintain its deformed shape accurately when the deforming force is removed, unless it is affixed to a properly shaped base 88, as in FIG. 13, numeral 58 The base 88 is preferably the same structure that is used as the die in the deforming step 56, with the deformed detector array structure 20. The deformed and curved monolithic microelectronic array structure 20 may be affixed to the base 88 by any operable approach, with an adhesive such as an epoxy preferred.

Figure 13:
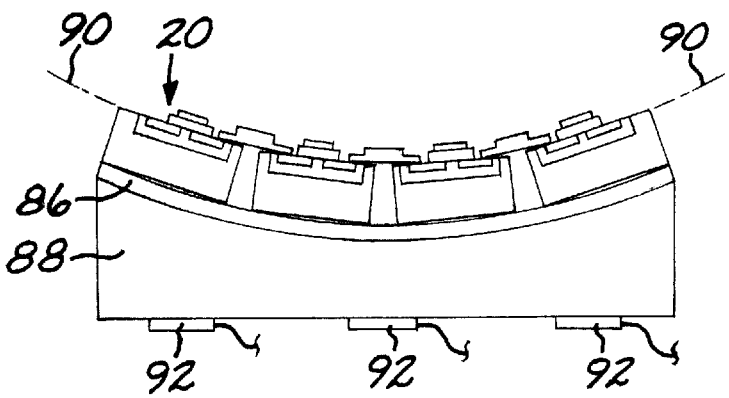

The base 88 may be rigid, or it may instead be actively flexed by a flexure mechanism such as actuators 92 shown in FIG. 13 to alter the optical figure of the structure. Some examples of flexure mechanisms for the base 88 include piezoelectric devices, bimetallic devices, or bladders. That is, the focal distance or pointing direction of the light input to each of the detector elements (or emitter elements, or other supported elements) of the monolithic microelectronic array structure 20 may be actively controlled by controllably flexing the base 88 to locally change the shape of the curved surface 90.

The present invention has been reduced to practice by the approach described herein, to produce both flat (planar) and curved monolithic microelectronic array structures.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A monolithic microelectronic array structure comprising:
    a microelectronic integrated circuit array comprising a first plurality of microelectronic integrated circuit elements, each deposited on a front side of one of a plurality of substantially inflexible substrates, the substrates being physically discontinuous so that each substrate comprises a substrate island which is physically separated from the other substrate islands;
    a second plurality of electrically conductive, structurally flexible deposited interconnects extending between the microelectronic integrated circuit elements of adjacent substrate islands.

2. The monolithic microelectronic array structure of claim 1, wherein each microelectronic integrated circuit element comprises an electrical interface circuit, and an input/output element supported on the electrical interface circuit element.

3. The monolithic microelectronic array structure of claim 2, wherein the electrical interface circuit is a readout integrated circuit, and the input/output element is a detector.

4. The monolithic microelectronic array structure of claim 2, wherein the electrical interface circuit is a driver integrated circuit, and the input/output element is an emitter.

5. The monolithic microelectronic array structure of claim 1, wherein the monolithic microelectronic array structure is substantially planar.

6. The monolithic microelectronic array structure of claim 1, wherein the monolithic microelectronic array structure is curved.

7. The monolithic microelectronic array structure of claim 1, wherein each electrically conductive interconnect between two substrate islands is curved in a perpendicular plane that is perpendicular to an extrapolated intersection line between the two substrate islands it connects.

8. The monolithic microelectronic array structure of claim 1, wherein each electrically conductive interconnect between two substrate islands is curved in an included plane that includes an extrapolated intersection line between the two substrate islands it connects.

9. The monolithic microelectronic array structure of claim 1, wherein the monolithic microelectronic array structure further includes a continuous flexible support to which a back side of each substrate island is affixed.

10. The monolithic microelectronic array structure of claim 1, wherein there is exactly one microelectronic integrated circuit element on each substrate island.

11. The monolithic microelectronic array structure of claim 1, wherein there is more than one microelectronic integrated circuit element on each substrate island.

12. A monolithic microelectronic array structure comprising:

an interface integrated circuit array comprising a first plurality of interface integrated circuit elements, each deposited on a front side of one of a plurality of substrates, the substrates being physically discontinuous so that each substrate comprises a substrate island which is physically separated from the other substrate islands;

a first plurality of input/output elements with a respective input/output element associated with and directly connected to each of the interface integrated circuit elements; and a second plurality of electrically conductive interconnects extending between the interface integrated circuit elements of adjacent substrate islands.

13. The monolithic microelectronic array structure of claim 12, wherein the interface integrated circuit elements are readout integrated circuits, and the input/output elements are detectors.

14. The monolithic microelectronic array structure of claim 12, wherein the interface integrated circuit elements are driver integrated circuits, and the input/output elements are emitters.

15. The monolithic microelectronic array structure of claim 12, wherein the monolithic microelectronic array structure is substantially planar.

16. The monolithic microelectronic array structure of claim 12, wherein the monolithic microelectronic array structure is curved.

17. The monolithic microelectronic array structure of claim 12, wherein each electrically conductive interconnect is structurally flexible.

18. The monolithic microelectronic array structure of claim 12, wherein each electrically conductive interconnect between two substrate islands is curved in a perpendicular plane that is perpendicular to an extrapolated intersection line between the two substrate islands it connects.

19. The monolithic microelectronic array structure of claim 12, wherein each electrically conductive interconnect between two substrate islands is curved in an included plane that includes an extrapolated intersection line between the two substrate islands it connects.

20. The monolithic microelectronic array structure of claim 12, wherein each substrate is made of a substantially inflexible material, and wherein the monolithic microelectronic array structure further includes a continuous flexible support to which a back side of each substrate island is affixed.

21. A method for preparing a monolithic microelectronic array structure, comprising the steps of providing an initial structure comprising a substantially inflexible, planar, physically continuous substrate, and a first plurality of microelectronic integrated circuit elements each deposited on a front side of the planar physically continuous substrate;

depositing a second plurality of electrically conductive, structurally flexible interconnects extending between adjacent microelectronic integrated circuit elements; and deep etching the planar physically continuous substrate from a back side thereof to form a deep-etched structure and to physically separate the planar physically continuous substrate into a third plurality of physically discontinuous substrate islands with at least one of the electrically conductive interconnects extending between each adjacent substrate island.

22. The method of claim 21, including an additional step, after the step of deep etching, of deforming the deep-etched structure into a curved structure.

23. The method of claim 21, including an additional step of depositing a continuous flexible support to which a back side of each substrate island is affixed.

* * * * *